(12) United States Patent
Takegoshi et al.

(10) Patent No.: US 11,154,960 B2
(45) Date of Patent: Oct. 26, 2021

(54) POLISHING PAD AND POLISHING METHOD USING SAME

(71) Applicant: KURARAY CO., LTD., Kurashiki (JP)

(72) Inventors: Minori Takegoshi, Kurashiki (JP); Mitsuru Kato, Kurashiki (JP); Chihiro Okamoto, Kurashiki (JP); Shinya Kato, Chiyoda-ku (JP)

(73) Assignee: KURARAY CO., LTD., Kurashiki (JP)

( * ) Notice: Subject to any disclaimer, the term of this patent is extended or adjusted under 35 U.S.C. 154(b) by 404 days.

(21) Appl. No.: 16/311,518

(22) PCT Filed: Jul. 26, 2017

(86) PCT No.: PCT/JP2017/027095
§ 371 (c)(1),
(2) Date: Dec. 19, 2018

(87) PCT Pub. No.: WO2018/021428
PCT Pub. Date: Feb. 1, 2018

(65) Prior Publication Data
US 2019/0232460 A1 Aug. 1, 2019

(30) Foreign Application Priority Data
Jul. 29, 2016 (JP) .............................. JP2016-150389

(51) Int. Cl.
*B24B 37/24* (2012.01)
*H01L 21/304* (2006.01)
(Continued)

(52) U.S. Cl.
CPC ............ *B24B 37/24* (2013.01); *B24B 37/044* (2013.01); *B24B 37/20* (2013.01); *B24D 3/00* (2013.01);
(Continued)

(58) Field of Classification Search
None
See application file for complete search history.

(56) References Cited

U.S. PATENT DOCUMENTS

| 2005/0208883 A1 | 9/2005 | Yoshida et al. |
| 2006/0037699 A1 | 2/2006 | Nakamori et al. |

(Continued)

FOREIGN PATENT DOCUMENTS

| JP | 2004-297061 A | 10/2004 |
| JP | 2005-294661 A | 10/2005 |

(Continued)

OTHER PUBLICATIONS

International Search Report dated Oct. 3, 2017 in PCT/JP2017/027095 filed Jul. 26, 2017.

(Continued)

*Primary Examiner* — Jiong-Ping Lu
(74) *Attorney, Agent, or Firm* — Oblon, McClelland, Maier & Neustadt, L.L.P.

(57) ABSTRACT

Provided is a polishing pad including a polishing surface having a zeta potential of +0.1 mV or more at a pH of 10.0. Preferably, a polishing pad including a polyurethane having a tertiary amine is provided. Further preferably, the polyurethane having a tertiary amine is a reaction product of a polyurethane reaction raw material containing at least a chain extender having a tertiary amine. A polishing method using the polishing pads is also provided, wherein the method is performed while supplying an alkaline polishing slurry.

11 Claims, 1 Drawing Sheet

(51) Int. Cl.
  *H01L 21/306* (2006.01)
  *B24B 37/20* (2012.01)
  *B24D 3/00* (2006.01)
  *B24B 37/04* (2012.01)
  *H01L 21/3105* (2006.01)
  *H01L 21/321* (2006.01)

(52) U.S. Cl.
  CPC ...... *H01L 21/304* (2013.01); *H01L 21/30625* (2013.01); *H01L 21/31053* (2013.01); *H01L 21/3212* (2013.01)

(56) References Cited

U.S. PATENT DOCUMENTS

| | | |
|---|---|---|
| 2007/0167116 A1 | 7/2007 | Yoshida et al. |
| 2008/0085943 A1 | 4/2008 | Doura et al. |
| 2010/0009612 A1 | 1/2010 | Park et al. |
| 2015/0183081 A1 | 7/2015 | Deng |
| 2017/0120416 A1* | 5/2017 | Chockalingam ........ B24B 37/26 |

FOREIGN PATENT DOCUMENTS

| | | | | |
|---|---|---|---|---|
| JP | 2007131672 | * | 5/2007 | ............. B24B 37/00 |
| JP | 2013-18056 A | | 1/2013 | |
| WO | WO 2008/029725 A1 | | 3/2008 | |
| WO | WO 2017/074773 A1 | | 5/2017 | |

OTHER PUBLICATIONS

Extended European Search Report dated Feb. 28, 2020 in corresponding European Patent Application No. 17834430.5, 7 pages.

* cited by examiner

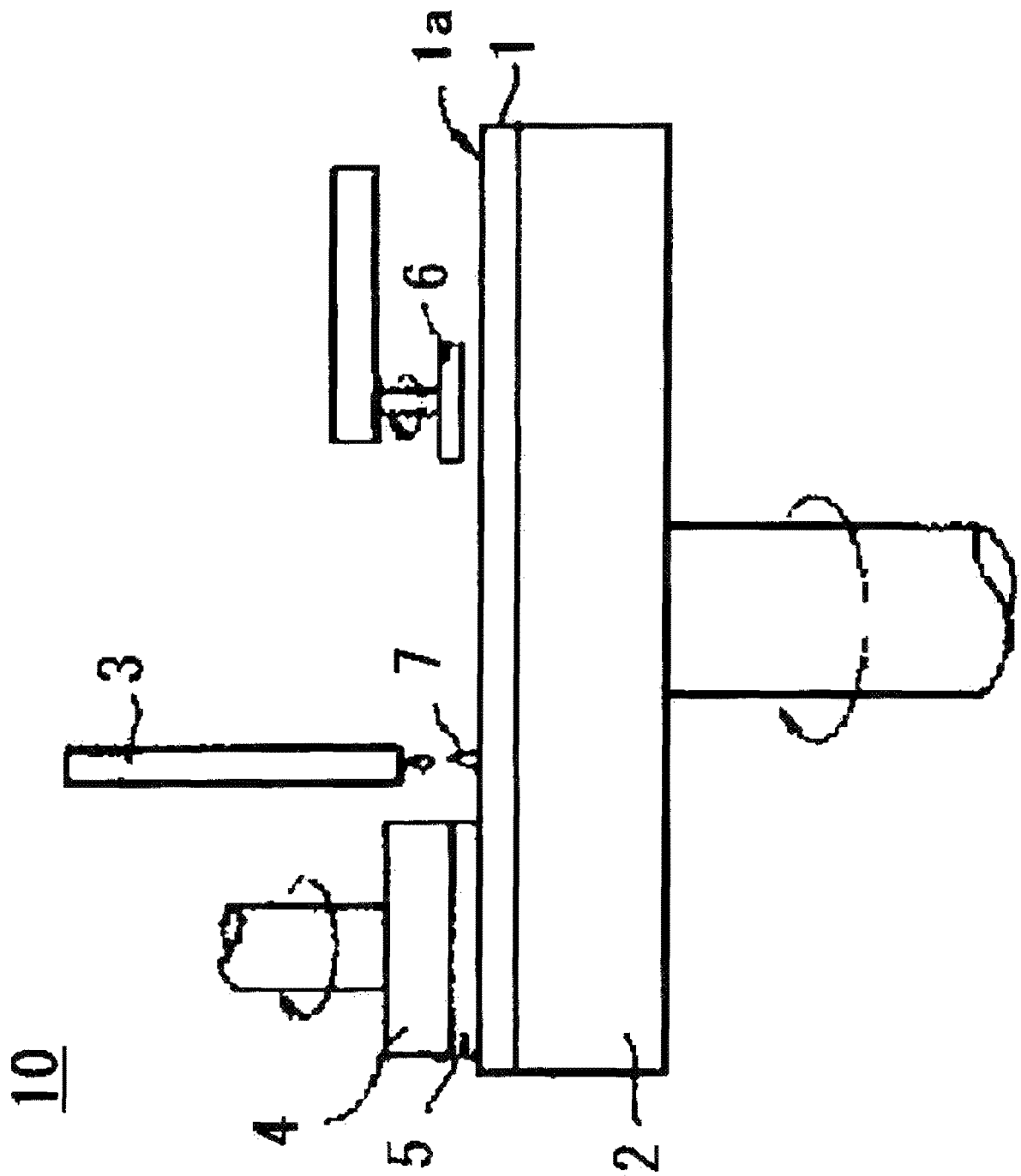

POLISHING PAD AND POLISHING METHOD USING SAME

TECHNICAL FIELD

The present invention relates to a polishing pad and a polishing method using the same. More particularly, the present invention relates to a polishing pad that can be preferably used for chemical mechanical polishing (CMP) and a polishing method using the same.

BACKGROUND ART

CMP is known as a polishing method used in the step of mirror-finishing a semiconductor wafer, and the step of planarizing the surface of an object to be polished including an insulating film such as an oxide film or a conductor film when forming a circuit on a semiconductor substrate. CMP is a method in which the surface to be polished of an object to be polished is polished with high precision by using the polishing surface of a polishing pad, while supplying a polishing slurry (hereinafter also referred to simply as "slurry") containing abrasive grains and a reaction liquid onto the surface of the object to be polished.

A polishing pad composed mainly of a polymer foam having a closed-cell structure is known as a polishing pad for CMP. The polishing pad composed mainly of a polymer foam has a higher hardness than the non-woven fabric-type polishing pad, and thus exhibits an excellent planarization performance. As the polishing pad composed mainly of a polymer foam, a polishing pad constituted by a foamed polyurethane molded article obtained by foaming and molding a two-liquid curable polyurethane by casting is widely used. The foamed polyurethane molded article is preferably used as a material for the polishing pad due to its excellent abrasion resistance.

Meanwhile, with the recent increase in the level of integration and the number of multilayered interconnections of circuits formed on a semiconductor substrate, there is a need for a higher planarization performance and an enhanced productivity for the CMP.

For example, PTL 1 listed below discloses a polishing pad that reduces the time required for a preparation step (break-in) of roughening the surface of a polishing pad by a dressing treatment in the initial usage stage in which the polishing pad is attached to a polishing device and the polishing device is started. Specifically, PTL 1 discloses a polishing pad including a polishing surface pressed onto an object to be polished, wherein corrugations on the polishing surface have a cycle in the range of 5 mm to 200 mm, and a largest amplitude of 40 μm or less. PTL 1 also discloses that when the zeta potential of the polishing surface of the polishing pad is −50 mV or more and less than 0 mv, repulsion against minus abrasive particles of slurry for the polishing surface is controlled, and a fit between the polishing surface of the polishing pad and the slurry thus becomes better, as a result of which the break-in time can be reduced.

PTL 2 listed below discloses a polishing pad that inhibits the adhesion of polishing debris to the surface of the polishing pad so as to reduce the occurrence of scratches and defects on the surface of the object to be polished, thus increasing the product yield, and achieving high planarization performance and an adequate polishing rate. Specifically, PTL 2 discloses a polishing pad wherein a zeta potential of a polishing surface opposing the object to be polished is less than −55 my and −100 mV or more.

PTL 3 listed below discloses a polishing pad that can perform polishing with a low load without causing defects in an insulating layer during CMP, and is fixed to a platen when used for polishing. Specifically, PTL 3 discloses a polishing pad wherein a material having a tensile modulus at room temperature of 0.2 GPa or more, and a positive zeta potential, specifically, +0.1 to +30 mV, in a pH region of an abrasive supplied between an object to be polished and the polishing pad is used for at least a portion of the surface of the object to be polished that comes into contact with the polishing pad. PTL 3 also discloses a polishing pad wherein the zeta potential becomes positive when CMP is performed using an acidic abrasive having a pH of 3 to 5.

CITATION LIST

Patent Literatures

[PTL 1] WO 2008/029725 pamphlet
[PTL 2] Japanese Laid-Open Patent Publication No. 2013-018056
[PTL 3] Japanese Laid-Open Patent Publication No. 2005-294661

SUMMARY OF INVENTION

Technical Problem

As the polishing slurry used for CMP, an acidic polishing slurry and an alkaline polishing slurry are available, and either one of them may be selected according to the purpose of polishing. In the case of performing a multi-step polishing process, an acidic polishing slurry and an alkaline polishing slurry may be used in combination. With a polishing pad wherein the zeta potential becomes positive when an acidic polishing slurry having a pH of 3 to 5 as the one disclosed in PTL 3 is used, it is possible to maintain a positive zeta potential, such as +0.1 mV or more, in the case of using an acidic polishing slurry, and effects thereby can also be expected to be achieved. However, even for a polishing pad wherein the zeta potential becomes positive when a polishing slurry having a pH of 3 to 5 is used, the zeta potential becomes negative when an alkaline polishing slurry is used. In such a case, the polishing rate may be reduced.

It is an object of the present invention to provide a polishing pad that can maintain a high polishing rate even when CMP is performed using an alkaline polishing slurry, and a polishing method using the same.

Solution to Problem

An aspect of the present invention is directed to a polishing pad including a polishing surface having a zeta potential of +0.1 mV or more at a pH of 10.0. With such a polishing pad, it is possible to achieve a high polishing rate and excellent polishing uniformity not only when CMP is performed using an acidic polishing slurry, but also when CPM is performed using an alkaline polishing slurry.

It is preferable that the polishing pad includes a polyurethane having a tertiary amine, since the tertiary amine is positively ionized to make the zeta potential positive when an alkaline slurry is used. Examples of the polyurethane having a tertiary amine include a polyurethane that is a reaction product of a reaction raw material containing at least a chain extender having a tertiary amine, a polymer polyol, and an organic polyisocyanate. Such a polishing pad is preferable in that the zeta potential at a pH of 10.0 is likely to be +0.1 mV or more.

Examples of the chain extender having a tertiary amine include 2,2'-methylimino diethanol, 2,2'-ethylimino diethanol, 2,2'-n-butylimino diethanol, 2,2'-t-butylimino diethanol, 3-(dimethylamino)-1,2-propane diol, and 3-(diethylamino)-1,2-propane diol.

It is preferable that the polyurethane reaction raw material contains 0.5 to 30 mass % of the chain extender having a tertiary amine, since the zeta potential at a pH of 10.0 is likely to be +0.1 mV or more.

Preferably, the polyurethane reaction raw material further contains a chain extender having no tertiary amine, and a content ratio of the chain extender having a tertiary amine relative to a total amount of the chain extender having a tertiary amine and the chain extender having no tertiary amine is 5 to 95 mol %.

It is preferable that the polyurethane having a tertiary amine is a thermoplastic polyurethane that is a reaction product of the polyurethane reaction raw material containing at least the chain extender having a tertiary amine, a polymer diol, and an organic diisocyanate, and it is particularly preferable that the polymer diol contains 30 to 100 mass % of polyethylene glycol, since excellent productivity and a high hardness can be achieved, thus making it possible to easily achieve a high polishing rate and excellent polishing uniformity. It is preferable that the polymer diol has a number-average molecular weight of 450 to 3000, since the required characteristics such as hydrophilicity can be satisfied even when the zeta potential at a pH of 10.0 is adjusted to be +0.1 mV or more.

It is preferable that a content of nitrogen derived from an isocyanate group included in the organic diisocyanate is 4.5 to 7.6 mass %, since a higher polishing rate and higher polishing uniformity can be achieved.

When the polishing pad has a storage modulus of 50 to 1200 MPa at 50° C. after swollen to saturation with water at 50° C., and a contact angle with water of 80 degrees or less, the polishing pad also has excellent polishing uniformity and polishing stability.

It is preferable that the polishing pad is a non-foam, since the polishing characteristics are less likely to vary, thus making it possible to achieve stable polishing.

Another aspect of the present invention is directed to a polishing method including the steps of: fixing any one of the above described polishing pads onto a platen of a polishing device; causing an object to be polished to be held on a holder of the polishing device so as to be opposed to the polishing surface of the polishing pad; and polishing the object to be polished by causing the polishing pad and the object to be polished to slide relative to each other, while supplying an alkaline polishing slurry between the polishing surface and the object to be polished. With such a method, it is possible to maintain a high polishing rate and high polishing uniformity even when CMP is performed using an alkaline polishing slurry.

Advantageous Effects of Invention

With the polishing pad according to the present invention, it is possible to achieve a high polishing rate even when CMP is performed using an alkaline polishing slurry.

BRIEF DESCRIPTION OF DRAWING(S)

FIG. 1 is an explanatory diagram illustrating a polishing method using a polishing pad according to an embodiment.

DESCRIPTION OF EMBODIMENT

A polishing pad according to one embodiment of the present invention will now be described. The polishing pad of the present embodiment is a polishing pad including a polishing surface with a zeta potential of +0.1 mV or more at a pH of 10.0.

Here, a zeta potential is a potential that is generated on the surface (slip plane) of an electric double layer by counter ion according to the surface electric charge of a substance when the substance comes into contact with a liquid. In the present embodiment, the zeta potential of the polishing surface of the polishing pad can be measured, for example, with an electrophoretic light scattering device (ELS-Z, manufactured by Otsuka Electronics Co., Ltd.) using a monitor latex (manufactured by Otsuka Electronics Co., Ltd.) dispersed in a 10 mM aqueous NaCl solution that has been adjusted to a pH of 10.0 with an aqueous NaOH solution.

The polishing pad of the present embodiment includes a polishing surface having a zeta potential of +0.1 mV or more, preferably +0.1 to +30 mV, more preferably +1.0 to +27 mV, particularly preferably +3.0 to +24 mV, most preferably +5.0 to +21 mV, at a pH of 10.0. When the zeta potential of the polishing surface of the polishing pad at a pH of 10.0 is less than +0.1 mV, the polishing rate is reduced because the polishing slurry and the polishing surface electrically repulse each other. On the other hand, when the zeta potential of the polishing surface at a pH of 10.0 is too high, the amount of the polishing slurry held an the polishing surface increases too much, so that scratches tend to occur on the surface to be polished of the object to be polished.

Further, it is preferable that the polishing pad of the present embodiment has a polishing surface having a zeta potential of +0.1 mV or more, more preferably +0.1 to +40 mV, particularly preferably +6.0 to +30 mV, especially preferably +10.0 to +30 mV, at a pH of 4.0, since the above-described polishing pad having a zeta potential of +0.1 mV or more at a pH of 10.0 can be easily obtained.

Hereinafter, a material and a production method of a polishing pad for achieving the polishing pad according to the present embodiment will be described in detail.

There is no particular limitation with respect to the material that is used for producing the polishing pad of the present embodiment, so long as a polishing pad including a polishing surface having a zeta potential of +0.1 mV or more at a pH of 10.0 can be obtained. Specific examples thereof include polymer materials, including, for example, polyurethane, polyolefins such as polyethylene or polypropylene, polyester, polyamide, polyurea, polytetrafluoroethylene, a melamine resin, neoprene (registered trademark), a silicone rubber, and a fluorine rubber, and a polymer material including a surface having a zeta potential of +0.1 mV or more at a pH of 10.0 is selected. As for the type of the polymer materials, polyurethanes such as a thermoplastic polyurethane and a thermosetting polyurethane are preferable since they have excellent abrasion resistance, and, in particular, a thermoplastic polyurethane is preferable since a high hardness can be provided, thus making it possible to easily achieve a high polishing rate and excellent polishing uniformity.

The polymer material has a storage modulus of preferably 50 to 1200 MPa, more preferably 100 to 1100 MPa, particularly preferably 200 to 1000 MPa, at 50° C. after swollen to saturation with 50° C. water. When the storage modulus of the polymer material at 50° C. after swollen to saturation with 50° C. water is too low, the polishing pad tends to become too soft, resulting in a reduction in the polishing rate. When it is too high, scratches tend to occur on the surface to be polished of the object to be polished.

The polymer material has a contact angle with water of preferably 80 degrees or less, more preferably 78 degrees or less, particularly preferably 76 degrees or less, especially preferably 74 degrees or less. When the contact angle with water of the polymer material is too large, scratches tend to occur owing to a reduction in the hydrophilicity of the polishing surface of the polishing pad.

Although the polymer material may be either a foam or a non-foam, a non-foam is particularly preferable since the polishing characteristics are less likely to vary and thus can achieve stable polishing. For example, in the case of a polishing pad using a foam such as a foamed polyurethane produced by forming and curing by casting, the polishing characteristics such as the flatness and the planarization efficiency tend to easily fluctuate due to variations of the foam structure, and increasing the hardness for enhancing the planarization performance tends to be difficult.

In the present embodiment, a polyurethane having a tertiary amine will be described in detail as a representative example of the polymer material that can provide a polishing pad including a polishing surface having a zeta potential of +0.1 mV or more at a pH of 10.0, and also can achieve preferred properties as those described above.

For example, the polyurethane having a tertiary amine that is used for producing the polishing pad of the present embodiment is a reaction product of a polyurethane reaction raw material containing at least a chain extender having a tertiary amine, a polymer polyol, and an organic polyisocyanate. The thermoplastic polyurethane having a tertiary amine is a reaction product obtained by polymerizing a polyurethane reaction raw material containing at least a chain extender having a tertiary amine, a polymer diol, and an organic diisocyanate. The polyurethane reaction raw material may optionally contain a chain extender having no tertiary amine. The thermoplastic polyurethane having a tertiary amine is particularly preferable since it can form a surface having a zeta potential of +0.1 mV or more at a pH of 10.0, and can easily provide the storage modulus at 50° C. after swollen to saturation with water at 50° C. and the contact angle with water described above.

Specific examples of the chain extender having a tertiary amine include 2,2'-methylimino diethanol, 2,2'-ethylimino diethanol, 2,2'-n-butylimino diethanol, 2,2'-t-butylimino diethanol, 3-(dimethylamino)-1,2-propane diol, and 3-(diethylamino)-1,2-propane diol. These may be used alone or in a combination of two or more. Among these, 2,2'-ethylimino diethanol is preferable since a polishing pad including a polishing surface having a zeta potential of +0.1 mV or more at a pH of 10.0 can be produced economically.

The content ratio of the chain extender having a tertiary amine contained in the polyurethane reaction raw material is preferably 0.1 to 30 mass %, more preferably 0.5 to 28 mass %, particularly preferably 1 to 26 mass %. When the content ratio of the chain extender having a tertiary amine is too low, the zeta potential of the polishing surface at a pH of 10.0 is less than 0.1 mV, so that the polishing rate tends to be reduced.

When the polyurethane reaction raw material further contains a chain extender having no tertiary amine, the ratio (mol %) of the chain extender having a tertiary amine relative to the total amount of the chain extender having a tertiary amine and the chain extender having no tertiary amine is preferably 5 to 95 mol %, more preferably 10 to 90 mol %.

Examples of the chain extender having no tertiary amine include low-molecular weight compounds having a molecular weight of 300 or less that have been conventionally used for producing a polyurethane, the low-molecular weight compounds having no tertiary amine, and having, in the molecule, two or more active hydrogen atoms capable of reacting with an isocyanate group. Specific examples thereof include diols such as ethylene glycol, diethylene glycol, 1,2-propane diol, 1,3-propane diol, 2,2-diethyl-1,3-propane diol, 1,2-butane diol, 1,3-butane diol, 2,3-butane diol, 1,4-butane diol, 1,5-pentane diol, neopentyl glycol, 1,6-hexane diol, 3-methyl-1,5-pentane diol, 1,4-bis(β-hydroxyethoxy) benzene, 1,4-cyclohexane diol, cyclohexane dimethanol (e.g., 1,4-cyclohexane dimethanol), bis(β-hydroxyethyl)terephthalate, 1,9-nonane diol, m-xylylene glycol, p-xylylene glycol, diethylene glycol, and triethylene glycol; and diamines such as ethylene diamine, trimethylene diamine, tetramethylene diamine, hexamethylene diamine, heptamethylene diamine, octamethylene diamine, nonamethylene diamine, decamethylene diamine, undecamethylene diamine, dodecamethylene diamine, 2,2,4-trimethyl hexamethylene diamine, 2,4,4-trimethyl hexamethylene diamine, 3-methyl pentamethylene diamine, 1,2-cyclohexane diamine, 1,3-cyclohexane diamine, 1,4-cyclohexane diamine, 1,2-diamino propane, hydrazine, xylylene diamine, isophorone diamine, piperazine, o-phenylene diamine, m-phenylene diamine, p-phenylene diamine, tolylene diamine, xylene diamine, adipic acid hydrazide, isophthalic acid hydrazide, 4,4'-diaminodiphenylmethane, 4,4'-diaminodiphenyl ether, 4,4'-bis(4-aminophenoxy)biphenyl, 4,4'-bis(3-aminophenoxy) biphenyl, 1,4-bis(4-aminophenoxy)benzene, 1,3-bis(4-aminophenoxy)benzene, 1,3-bis(3-aminophenoxy)benzene, 3,4'-diaminodiphenyl ether, 4,4'-diaminodiphenyl sulfone, 3,4-diaminodiphenyl sulfone, 3,3'-diaminodiphenyl sulfone, 4,4'-methylene-bis(2-chloroaniline), 3,3'-dimethyl-4,4'-diaminobiphenyl, 4,4'-diaminodiphenyl sulfide, 2,6-diaminotoluene, 2,4-diaminochlorobenzene, 1,2-diaminoanthraquinone, 1,4-diaminoanthraquinone, 3,3'-diaminobenzophenone, 3,4-diaminobenzophenone, 4,4'-diaminobenzophenone, 4,4'-diaminobibenzyl, 2,2'-diamino-1,1'-binaphthalene, 1,n-bis (4-aminophenoxy)alkane (n is 3 to 10) such as 1,3-bis(4-aminophenoxy)alkane, 1,4-bis(4-aminophenoxy)alkane and 1,5-bis(4-aminophenoxy)alkane, 1,2-bis[2-(4-aminophenoxy)ethoxy]ethane, 9,9-bis(4-aminophenyl) fluorene, and 4,4'-diaminobenzanilide. These may be used alone or in a combination of two or more. Among these, 1,4-butane diol is preferable.

Specific examples of the polymer polyol include polyether polyol, polyester polyol, and polycarbonate polyol. In the case of producing a thermoplastic polyurethane, it is possible to use, for example, polymer diols such as a polyether diol, a polyester diol, and a polycarbonate diol. These may be used alone or in a combination of two or more.

In the following, a polymer diol used in the case of producing a thermoplastic polyurethane will be described in detail.

The number-average molecular weight of the polymer diol is preferably 450 to 3000, more preferably 500 to 2700, particularly preferably 500 to 2400, since a polishing pad including a polishing surface having a zeta potential of +0.1 to +30 mV at a pH of 10.0 can be easily obtained while maintaining the required characteristics such as the rigidity, the hardness, and the hydrophilicity. Note that the number-average molecular weight of the polymer diol means a number-average molecular weight calculated based on the hydroxyl value measured in accordance with JIS K 1557.

Specific examples of the polyether diol include polyethylene glycol, polypropylene glycol, polytetramethylene glycol, poly(methyltetramethylene glycol), and glycerin-based polyalkylene ether glycol. These may be used alone or in a combination of two or more. Among these, polyethylene glycol and polytetramethylene glycol are preferable, and polyethylene glycol is particularly preferable.

A polyester diol can be obtained, for example, by a direct esterification reaction or a transesterification reaction between a dicarboxylic acid or an ester-forming derivative thereof (e.g., an ester, anhydride, etc.) and a low-molecular weight diol.

Specific examples of the dicarboxylic acid for producing a polyester diol include aliphatic dicarboxylic acids, including, for example, C2-12 aliphatic dicarboxylic acids such as oxalic acid, succinic acid, glutaric acid, adipic acid, pimelic acid, suberic acid, azelaic acid, sebacic acid, dodecanedicarboxylic acid, 2-methylsuccinic acid, 2-methyladipic acid, 3-methyladipic acid, 3-methylpentanedioic acid, 2-methyloctanedioic acid, 3,8-dimethyldecanedioic acid and 3,7-dimethyldecanedioic acid; and also C14-48 dimerized aliphatic dicarboxylic acids (dimer acids) obtained by the dimerization of unsaturated fatty acids obtained by the fractional distillation of triglycerides, as well as the hydrogenated products from these C14-48 dimerized aliphatic dicarboxylic acids (hydrogenated dimer acids); alicyclic dicarboxylic acids such as 1,4-cyclohexanedicarboxylic acid; and aromatic dicarboxylic acids such as terephthalic acid, isophthalic acid and ortho-phthalic acid. Specific examples of the dimer acid and the hydrogenated dimer acid include "Pripol 1004", "Pripol 1006", "Pripol 1009", and "Pripol 1013" (trade names, manufactured by Unichema). These may be used alone or in a combination of two or more.

Specific examples of the low-molecular weight diol for producing a polyester diol include aliphatic diols such as ethylene glycol, 1,3-propanediol, 1,2-propanediol, 2-methyl-1,3-propanediol, 1,4-butanediol, neopentyl glycol, 1,5-pentanediol, 3-methyl-1,5-pentanediol, 1,6-hexanediol, 1,7-heptanediol, 1,8-octanediol, 2-methyl-1,8-octanediol, 1,9-nonanediol and 1,10-decanediol; and alicyclic diols such as cyclohexanedimethanol and cyclohexanediol. These may be used alone or in a combination of two or more. Among these, C6-12 diols are preferable, C8-10 diols are more preferable, and C9 diols are particularly preferable.

Examples of the polycarbonate diol include polycarbonate diols obtained by the reaction of a low-molecular weight diol and a carbonate compound such as dialkyl carbonate, alkylene carbonate, and diaryl carbonate. Examples of the low-molecular weight diol for producing the polycarbonate diol include the low-molecular weight diols listed above as examples. Examples of the dialkyl carbonate include dimethyl carbonate and diethyl carbonate. Examples of the alkylene carbonate include ethylene carbonate. Examples of the diaryl carbonate include diphenyl carbonate.

The polymer diol contains polyethylene glycol at a ratio of preferably 30 to 100 mass %, more preferably 35 to 100 mass %, particularly preferably 40 to 100 mass %, especially preferably 50 to 100 mass %. In such a case, the degree of the phase separation between the segment derived from the polymer diol and the segments derived from the organic diisocyanate and the chain extender contained in the thermoplastic polyurethane becomes adequate, so that a thermoplastic polyurethane having a storage modulus of 50 to 1200 MPa at 50° C. after swollen to saturation with water at 50° C. can be easily obtained. Further, the inclusion of polyethylene glycol having high hydrophilicity makes it possible to easily obtain a highly hydrophilic thermoplastic polyurethane having a contact angle with water of 80° or less. When the ratio of the polyethylene glycol contained in the polymer diol is too low, the contact angle with water also tends to become too high.

As the organic polyisocyanate, organic polyisocyanates conventionally used for producing a polyurethane can be used without any particular limitation. In the case of producing a thermoplastic polyurethane, an organic diisocyanate can be used. Specific examples of the organic diisocyanate include aliphatic or alicyclic diisocyanates such as ethylene diisocyanate, tetramethylene diisocyanate, pentamethylene diisocyanate, hexamethylene diisocyanate, 2,2,4-trimethylhexamethylene diisocyanate, 2,4,4-trimethylhexamethylene diisocyanate, dodecamethylene diisocyanate, isophorone diisocyanate, isopropylidene bis(4-cyclohexyl isocyanate), cyclohexylmethane diisocyanate, methylcyclohexane diisocyanate, 4,4'-dicyclohexylmethane diisocyanate, lysine diisocyanate, 2,6-diisocyanatomethyl caproate, bis(2-isocyanatoethyl)fumarate, bis(2-isocyanatoethyl)carbonate, 2-isocyanatoethyl-2,6-diisocyanatohexanoate, cyclohexylene diisocyanate, methylcyclohexylene diisocyanate, and bis(2-isocyanatoethyl)-4-cyclohexylene; and aromatic diisocyanates such as 2,4'-diphenylmethane diisocyanate, 4,4'-diphenylmethane diisocyanate, 2,4-tolylene diisocyanate, 2,6-tolylene diisocyanate, m-phenylene diisocyanate, p-phenylene diisocyanate, m-xylylene diisocyanate, p-xylylene diisocyanate, 1,5-naphthylene diisocyanate, 4,4'-diisocyanatobiphenyl, 3,3'-dimethyl-4,4'-diisocyanatobiphenyl, 3,3'-dimethyl-4,4'-diisocyanatodiphenylmethane, chlorophenylene-2,4-diisocyanate, and tetramethylxylylene diisocyanate. These may be used alone or in a combination of two or more. Among these, 4,4'-diphenylmethane diisocyanate is particularly preferable in terms of the excellent abrasion resistance of the resulting polishing pad.

For the thermoplastic polyurethane, the content of the nitrogen atoms derived from the isocyanate group is preferably 4.5 to 7.6 mass %, more preferably 5.0 to 7.4 mass %, particularly preferably 5.2 to 7.3 mass %, since a thermoplastic polyurethane having a storage modulus of 50 to 1200 MPa at 50° C. after swollen to saturation with water at 50° C. can be easily obtained.

For example, a thermoplastic polyurethane can be produced by polymerization through a urethanation reaction using a known prepolymer method or one-shot method by using the above-described reaction material. Preferably, a thermoplastic polyurethane is obtained by a method in which continuous melt-polymerization is performed substantially in the absence of a solvent by using a single-screw or multi-screw extruder, while melt-mixing the above-described components mixed at a predetermined ratio.

The thermoplastic polyurethane obtained by performing continuous melt-polymerization can be, for example, pelletized, and subsequently molded into a sheet-like molded article by using any one of various molding methods such as extrusion molding, injection molding, blow molding, and calendering. In particular, extrusion molding using a T-die is preferable since a sheet-like molded article having a uniform thickness can be obtained.

The mixing ratio of the various components is appropriately adjusted according to the intended characteristics. For example, the components are preferably mixed such that the ratio of the isocyanate group contained in the organic polyisocyanate is preferably 0.95 to 1.3 moles, more preferably 0.96 to 1.10 moles, particularly preferably 0.97 to 1.05 mol, per mole of the active hydrogen atoms contained in the polymer polyol, the chain extender having a tertiary amine, and the chain extender having no tertiary amine. When the ratio of the isocyanate group contained in the organic polyisocyanate is too low, the mechanical strength and the abrasion resistance of the polyurethane tend to be reduced, resulting in a shorter life of the polishing pad. When the ratio of the isocyanate group contained in the organic polyisocyanate is too high, the productivity and the storage stability of the polyurethane tend to be reduced, making it difficult to produce a polishing pad.

The polyurethane may optionally contain additives such as a cross-linking agent, a filler, a cross-linking accelerator, a cross-linking auxiliary, a softening agent, a tackifier, an aging inhibitor, a foaming agent, a processing auxiliary, a tack-imparting agent, an inorganic filler, an organic filler, a crystal nucleating agent, a heat stabilizer, a weathering stabilizer, an antistatic agent, a colorant, a lubricant, a flame retardant, a flame retardant auxiliary (e.g., antimony oxide), a blooming inhibitor, a release agent, a thickener, an antioxidant, and a conductive agent. The content ratio of the additive in the polyurethane is not particularly limited, but is preferably 50 mass % or less, more preferably 20 mass % or less, particularly preferably 5 mass % or less.

The density of the molded article of the thermoplastic polyurethane is preferably 1.0 $g/cm^3$ or more, more preferably 1.1 $g/cm^3$ or more, particularly preferably 1.2 $g/cm^3$ or more. When the density of the molded article of the thermoplastic polyurethane is too low, the polishing pad tends to become soft, resulting in a reduction in the local flatness. As the thermoplastic polyurethane, an unfoamed thermoplastic polyurethane is particularly preferable because of the excellent polishing stability provided by high rigidity and material uniformity.

The polishing pad of the present embodiment is finished into a polishing pad by adjusting the dimensions, shape, thickness and the like of the above-described polyurethane sheet-like molded article through cutting, slicing, punching, and the like. The thickness of the polishing pad is not particularly limited, but is preferably 0.3 to 5 mm, more preferably 1.7 to 2.8 mm, particularly preferably 2.0 to 2.5 mm, from the viewpoint of the ease of production and handleability, and the stability of the polishing performance.

The hardness of the polishing pad is preferably 60 or more, more preferably 65 or more, as a JIS-D hardness. When the JIS-D hardness is too low, the ability of the polishing pad to follow the surface to be polished tends to be high, resulting in a reduction in the local flatness.

Preferably, recesses such as grooves and holes are formed in a predetermined pattern, for example, concentrically, on the polishing surface of the polishing pad of the present embodiment by grinding or laser processing. Such recesses are useful for uniformly and sufficiently supplying a polishing slurry to the polishing surface, as well as discharging polishing debris that could cause scratches and preventing a damage to the wafer caused by adsorption the polishing pad. For example, in the case of forming grooves concentrically, the interval between the grooves is preferably about 1.0 to 50 mm, more preferably about 1.5 to 30 mm, particularly preferably about 2.0 to 15 nm. The width of the grooves is preferably about 0.1 to 3.0 mm, more preferably about 0.2 to 2.0 mm. The depth of the grooves is preferably about 0.2 to 1.8 mm, more preferably about 0.4 to 1.5 mm. The cross-sectional shape of the grooves may be appropriately selected from, for example, a rectangular shape, a trapezoidal shape, a triangular shape, and a semicircular shape according to the purpose.

The polishing pad may be used as a single-layer pad composed only of a polishing layer, or may be used as a stacked pad in which a cushioning layer is stacked on the back side of a polishing surface of the polishing pad serving as a polishing layer. As the cushioning layer, it is preferable to use a material having a hardness lower than the hardness of the polishing pad serving as the polishing layer. When the hardness of the cushioning layer is lower than the hardness of the polishing pad serving as the polishing layer, the hard polishing pad follows the local irregularities of the surface to be polished, and the cushioning layer follows the warpage and the undulations on the entire base material to be polished, so that it is possible to achieve polishing that is well-balanced in the global flatness and the local flatness.

Specific examples of materials that can be used as the cushioning layer include composites (e.g., "Suba 400" manufactured by (Nitta Haas Incorporated)) obtained by impregnating a non-woven fabric with a polyurethane; rubbers such as a natural rubber, a nitrile rubber, a polybutadiene rubber and a silicone rubber; thermoplastic elastomers such as a polyester-based thermoplastic elastomer, a polyamide-based thermoplastic elastomer and a fluorine-based thermoplastic elastomer; foamed plastics; and polyurethanes. Among these, a polyurethane having a foam structure is particularly preferable because flexibility preferable for the cushioning layer can be easily achieved.

The thickness of the cushioning layer is not particularly limited, but is preferably 0.5 to 5 mm, for example. When the cushioning layer is too thin, the effect of following the warpage and the undulations on the entire material to be polished tends to be reduced, resulting in a reduction in the global planarization performance. On the other hand, when the cushioning layer is too thick, the polishing pad as a whole will become soft, making it difficult for polishing to be performed in a stable manner. In the case of stacking the cushioning layer on the polishing layer, the thickness of the polishing pad that will serve as the polishing layer is preferably about 0.3 to 5 mm.

Next, one embodiment of CMP using the polishing pad of the present embodiment will be described.

In the CMP, a CMP apparatus 10 including a rotary platen 2 that is circular as viewed in top view, a slurry supply nozzle 3, a carrier 4, and a pad conditioner 6 as shown in FIG. 1 is used, for example. A polishing pad 1 having a polishing surface 1a is attached to the surface of the rotary platen 2 using double-sided tape or the like. The carrier 4 supports an object to be polished 5.

In the CMP apparatus 10, the rotary platen 2 is rotated by a motor (not shown) in the direction indicated by the arrow. The carrier 4 is rotated, in the plane of the rotary platen 2, by a motor (not shown), for example, in the direction indicated by the arrow. The pad conditioner 6 is also rotated, in the plane of the rotary platen 2, by a motor (not shown), for example, in the direction indicated by the arrow.

First, while pouring distilled water onto the polishing surface 1a of the polishing pad 1 that is fixed to the rotary platen 2 and is rotated, the CMP pad conditioner 6 in which diamond particles are fixed onto the surface of a carrier by electrodeposition of nickel or the like is pressed against the polishing surface 1a so as to condition the polishing surface 1a. Through conditioning, the polishing surface 1a is adjusted to have a surface roughness suitable for polishing the surface to be polished. Next, a polishing slurry 7 is supplied from the slurry supply nozzle 3 to the surface of the rotating polishing pad 1. At the time of performing CMP, a lubricating oil, a coolant, and the like may be optionally used in combination with the polishing slurry.

As the polishing slurry, any polishing slurry for use in CMP that contains, for example, a liquid medium such as water or oil; an abrasive such as silica, alumina, cerium oxide, zirconium oxide or silicon carbide; a base; an acid; a surfactant; an oxidizing agent; a reducing agent; and a chelating agent can be used without any particular limitation. Although polishing slurries include an acidic slurry, an alkaline slurry, and a neutral slurry, any liquid polishing slurry can be used for the polishing pad of the present embodiment. Note that the polishing pad of the present embodiment achieves the effect of maintaining the high polishing rate when performing CMP using an alkaline polishing slurry having a pH of 7.0 to 14.0, in particular, a pH of 8.0 to 14.0.

Then, the surface to be polished of the object to be polished 5 that is fixed to the carrier 4 and is rotated is pressed against the polishing surface 1a on which the polishing slurry 7 are evenly spread. Then, the polishing treatment is continued until a predetermined flatness is achieved. Adjustment of the pressing force applied during polishing or the speed of relative movement between the rotary platen 2 and the carrier 4 affects the finishing quality.

The polishing conditions are not particularly limited. However, the rotational speed of each of the rotary platen and the carrier is preferably as low as 300 rpm or less in order to efficiently perform polishing, and the pressure applied to the object to be polished is preferably 150 kPa or less in order to prevent a flaw from being caused after polishing. During polishing, it is preferable that the polishing slurry is continuously supplied to the polishing surface using a pump or the like. The amount of the polishing slurry supplied is not particularly limited, but the polishing slurry is preferably supplied such that the polishing surface is constantly covered with the polishing slurry.

Then, after the object to be polished that has undergone polishing is fully washed with running water, it is preferable to dry the object to be polished by removing water droplets attached thereto by using a spin drier or the like. In this manner, a smooth surface can be achieved an the entirety of the surface to be polished as a result of polishing the surface to be polished with the polishing slurry.

Such CMP according to the present embodiment can be preferably used for polishing performed during the production process of various semiconductor devices, MEMS (MicroElectro Mechanical Systems), and the like. The CMP can be preferably used to polish objects to be polished, including, for example, an insulating film such as an oxide film formed on a semiconductor substrate; a wiring metal film of copper, aluminum, tungsten or the like; and a barrier metal film of tantalum, titanium, tantalum nitride, titanium nitride or the like, in particular, an insulating film such as an oxide film. The CPM can also be used to polish a metal film on which a pattern such as a wiring pattern or a dummy pattern is formed. The pitch between lines in the pattern may differ depending on the product, but is usually about 50 nm to 100 μm.

EXAMPLES

Hereinafter, the present invention will be described more specifically by way of examples. It should be appreciated that the scope of the invention is by no means limited to the examples.

Example 1

Polyethylene glycol having a number-average molecular weight of 600 [abbreviation: PEG600], 2,2'-methylimino diethanol [abbreviation: MIDE], 1,4-butane diol [abbreviation: BD], and 4,4'-diphenylmethane diisocyanate [abbreviation: MDI] were mixed at a mass ratio of PEG600:MIDE:BD:MDI of 26.6:18.2:1.5:53.6 (molar ratio of MIDE and BD: 90/10), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (hereinafter referred to as "PU-1"). Then, the contact angle with water and the storage modulus at 50° C. after swollen to saturation with water at 50° C. of PU-1 were determined by the following methods.

[Contact Angle with Water]

A film of PU-1 having a thickness of 300 μm was produced by hot pressing. The obtained film was allowed to stand for 3 days under the conditions: 20° C. and 65% RH, and subsequently the contact angle with water of the film was measured using a DropMaster 500 manufactured by Kyowa Interface Science Co., Ltd.

[Storage Modulus at 50° C. after Swollen to Saturation with Water at 50° C.]

An injection-molded sheet of PU-1 having a width of 5 mm, a length of 30 mm, and a thickness of 2 mm was produced. Then, the injection-molded sheet was immersed in water at 50° C. for 3 days. Then, after the water on the surface of the injection-molded sheet that had been taken out from the water was wiped off, the dynamic viscoelastic modulus at 50° C. was measured at a frequency of 11 Hz using a dynamic viscoelasticity measurement device ("DVE Rheospectoler", manufactured by Rheology Co. Ltd.), to determine the storage modulus.

Then, a polishing pad was produced using PU-1, and was evaluated in the following manner.

The pellet of PU-1 was supplied to a single-screw extrusion molder, and extruded using a T-die, to give a sheet having a thickness of 2.0 mm. Then, after the surface of the obtained sheet was ground to give a sheet having a uniform thickness of 1.5 mm, grooves having a width of 1.0 mm and a depth of 1.0 mm were formed concentrically at an interval of 6.5 mm on the surface, and the sheet was cut into a circular shape having a diameter of 380 mm, to produce a polishing pad.

[Measurement of Zeta Potential]

The surface of the polishing pad that had been cut out into a 30 mm×60 mm was washed. Then, using an electrophoretic light scattering device (ELS-Z, manufactured by Otsuka Electronics Co., Ltd.), the resulting sample was attached to a plate measurement cell, and measurement was carried out using a monitor latex (manufactured by Otsuka Electronics Co., Ltd.) dispersed in a 10 mM aqueous NaCl solution that had been adjusted to a pH of 10.0 with an aqueous NaOH solution. Similarly, the measurement was also carried also using a monitor latex dispersed in a 10 mM aqueous NaCl solution that had been adjusted to a pH of 4.0 with an aqueous HCl solution.

Then, the polishing performance of the obtained polishing pad was evaluated by the following methods.

[Polishing Performance]

The obtained polishing pad was attached to a polishing device "MAT-BC15" manufactured by MAT Inc. Then, while pouring distilled water at a rate of 150 mL/min, the surface of the pad was conditioned using a diamond dresser manufactured by A.L.M.T. Corp. (#100, coverage: 80%, diameter: 19 cm, mass: 1 kg), under the conditions: a dresser rotation rate of 140 rpm, a platen rotation rate of 100 rpm, and for 1 hour. Next a polishing slurry having a pH of 12 obtained by diluting two-fold a polishing slurry "SS-25" manufactured by Cabot Microelectronics was prepared. Then, while supplying the polishing slurry onto the polishing surface of the polishing pad at a rate of 120 mL/min, a 4-inch-diameter silicon wafer having a silicon oxide film with a thickness of 1000 nm on the surface thereof was polished for 60 seconds using the polishing pad under the conditions: a platen rotation rate of 100 rpm, a head rotation rate of 99 rpm, and a polishing pressure of 27.6 kPa. Then, after performing polishing for 60 seconds, the polishing pad was conditioned for 30 seconds. Then, another silicon wafer was polished with the polishing pad, and the polishing pad was further conditioned for 30 seconds. Thus, 10 silicon wafers were polished.

Then, the thicknesses before and after polishing of the silicon oxide film on the tenth silicon wafer that had been polished were measured at 49 points in the wafer plane, and the polishing rate at each of the points were determined. Then, the average value of the polishing rates at the 49 points was used as a polishing rate. The polishing uniformity was evaluated based on the nonuniformity determined by Formula (1) below. Smaller values of the nonuniformity indicate that the copper film was uniformly polished in the wafer plane, and that polishing uniformity was excellent.

$$\text{Nonuniformity (\%)} = (\sigma/R) \times 100 \tag{1}$$

(where $\sigma$ represents the standard deviation of the polishing rates at the 49 points, and R represents the average value of the polishing rates at the 49 points)

The tenth wafer that had been polished was observed with an object lens with magnification of ×50, using a laser microscope "VKX-200" manufactured by KEYENCE CORPORATION, and the presence or absence of scratches was determined.

The results of the above-described evaluations are collectively shown in Table 1 below.

TABLE 1

| Example No. | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Chain extender | BD | BD | BD | BD | BD | BD | BD | BD | BD | BD |
| Chain extender containing tertiary amine (type, mass %) | MIDE 18.2 | MIDE 9.9 | MIDE 1.9 | MIDE 12 | MIDE 4.4 | MIDE 13.5 | MIDE 10.7 | MIDE 18.9 | DMAPD 9.9 | MIDE 10.9 |
| Molar ratio of chain extender (BD/MIDE or DMAPD) | 10/90 | 50/50 | 90/10 | 50/50 | 50/50 | 50/50 | 50/50 | 50/50 | 50/50 | 50/50 |
| Polymer polyol | PEG600 | PEG600 | PEG600 | PEG2000 | PEG600 | PEG600 | PEG600/ PTG850 | PEG600/ PTG850 | PEG600 | PTG850 |
| Molar ratio of polymer polyol (PEG600/PTG850) | — | — | — | — | — | — | 70/30 | 40/60 | — | — |
| Organic diisocyanate | MDI | MDI | MDI | MDI | MDI | MDI | MDI | MDI | MDI | MDI |
| Content of nitrogen atoms derived from isocyanate group (mass %) | 6.0 | 6.0 | 6.0 | 6.0 | 4.5 | 7.0 | 6.0 | 6.0 | 6.0 | 6.0 |
| Zeta potential at pH of 10.0 [mV] | 26 | 18 | 9 | 23 | 23 | 14 | 18 | 21 | 20 | 19 |
| Zeta potential at pH of 4.0 [mV] | 30 | 24 | 14 | 29 | 28 | 20 | 25 | 27 | 25 | 27 |
| Storage modulus at 50° C. after swollen to saturation with water at 50° C. [MPa] | 535 | 540 | 561 | 430 | 325 | 976 | 625 | 675 | 512 | 650 |
| Contact angle with water [°] | 69 | 69 | 68 | 68 | 66 | 70 | 73 | 75 | 69 | 79 |
| Polishing rate [nm/min] | 320 | 302 | 283 | 274 | 291 | 286 | 314 | 309 | 311 | 299 |
| Polishing uniformity [%] | 6.9 | 5.9 | 6.3 | 6.4 | 5.5 | 7.3 | 6.8 | 5.9 | 6.4 | 5.8 |
| Presence or absence of scratches | Absent | Absent | Absent | Absent | Absent | Absent | Absent | Absent | Absent | Absent |

| Example No. | Com. Ex. 1 | Com. Ex. 2 | Com. Ex. 3 | Com. Ex. 4 | Com. Ex. 5 |
|---|---|---|---|---|---|
| Chain extender | BD | BD | BD | BD | BD |
| Chain extender containing tertiary amine (type, mass %) | — | — | — | — | — |
| Molar ratio of chain extender (BD/MIDE or DMAPD) | — | — | — | — | — |
| Polymer polyol | PEG600 | PEG4000 | PEG600 | PEG600 | PBA1000 |
| Molar ratio of polymer polyol (PEG600/PTG850) | — | — | — | — | — |
| Organic diisocyanate | MDI | MDI | MDI | MDI | MDI |
| Content of nitrogen atoms derived from isocyanate group (mass %) | 6.0 | 6.0 | 4.0 | 8.0 | 6.5 |
| Zeta potential at pH of 10.0 [mV] | −20 | −15 | −13 | −25 | −19 |
| Zeta potential at pH of 4.0 [mV] | −5 | −3 | −3 | −6 | 5.4 |
| Storage modulus at 50° C. after swollen to saturation with water at 50° C. [MPa] | 619 | 300 | 50 | 2000 | 492 |
| Contact angle with water [°] | 69 | 68 | 66 | 72 | 72 |
| Polishing rate [nm/min] | 254 | 245 | 159 | 235 | 240 |
| Polishing uniformity [%] | 8.1 | 8.8 | 9.8 | 10.1 | 8.5 |
| Presence or absence of scratches | Absent | Absent | Absent | Present | Present |

Example 2

Except for using a thermoplastic polyurethane (PU-2) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, MIDE, BD, and MDI were mixed at a mass ratio of PEG600:MIDE:BD:MDI of 29.0:9.9:7.5:53.6 (molar ratio of MIDE and BD: 50/50), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water, and subsequently finely cut into a pellet with a pelletizer. The obtained pellet was dried through dehumidification for 20 hours at 70° C., to produce a thermoplastic polyurethane (PU-2).

Example 3

Except for using a thermoplastic polyurethane (PU-3) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, MIDE, BD, and MDI were mixed at a mass ratio of PEG600:MIDE:BD:MDI of 31.3:1.9:13.1:53.6 (molar ratio of MIDE and BD: 10/90), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water, and subsequently finely cut into a pellet with a pelletizer. The obtained pellet was dried through dehumidification for 20 hours at 70° C., to produce a thermoplastic polyurethane (PU-3).

Example 4

Except for using a thermoplastic polyurethane (PU-4) produced in the following manner in place of PU-1, the thermoplastic polyurethane was evaluated, also a polishing pad was produced, and the polishing performance thereof was evaluated, in the same manner as in Example 1. The results are shown in Table 1.

Polyethylene glycol having a number-average molecular weight of 2000 [abbreviation: PEG2000], MIDE, BD, and MDI were mixed at a mass ratio of PEG2000:MIDE:BD:MDI of 25.3:12.0:9.1:53.6 (molar ratio of MIDE and BD: 50/50), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-4).

Example 5

Except for using a thermoplastic polyurethane (PU-5) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, MIDE, BD, and MDI were mixed at a mass ratio of PEG600:MIDE:BD:MDI of 52.0:4.4:3.3:40.2 (molar ratio of MIDE and BD: 50/50), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-5).

Example 6

Except for using a thermoplastic polyurethane (PU-6) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, MIDE, BD, and MDI were mixed at a mass ratio of PEG600:MIDE:BD:MDI of 13.7:13.5:10.2:62.6 (molar ratio of MIDE and BD: 50/50), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-6).

Example 7

Except for using a thermoplastic polyurethane (PU-7) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, a polytetramethylene glycol having a number-average molecular weight of 850 [abbreviation: PTG850], MIDE, BD, and MDI were mixed at a mass ratio of PEG600:PTG850:MIDE:BD:MDI of 17.6:10.7:10.3:7.8:53.6 (molar ratio of PEG600 and PTG850: 70/30, molar ratio of MIDE and BD: 50/50), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-7).

Example 8

Except for using a thermoplastic polyurethane (PU-8) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, PTG850, MIDE, BD, and MDI were mixed at a mass ratio of PEG600:PTG850:MIDE:BD:MDI of 8.9:18.9: 10.6:8.0:53.6 (molar ratio of PEG600 and PTG850: 40/60, molar ratio of MIDE and BD: 50/50), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-8).

Example 9

Except for using a thermoplastic polyurethane (PU-9) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, 3-(dimethylamino)-1,2-propane diol [abbreviation: DMAPD], BD, and MDI were mixed at a mass ratio of PEG600:DMAPD:BD:MDI of 29.0:9.9:7.5:53.6 (molar ratio of DMAPD and BD: 50/50), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-9).

Example 10

Except for using a thermoplastic polyurethane (PU-10) produced in the following manner in place of PU-1, the thermoplastic polyurethane was evaluated, also a polishing pad was produced, and the polishing performance thereof was evaluated, in the same manner as in Example 1. The results are shown in Table 1.

PTG850, MIDE, BD, and MDI were mixed at a mass ratio of PTG850:MIDE:BD:MDI of 27.3:10.9:8.2:53.6 (molar ratio of MIDE and BD: 50/50), and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-10).

Comparative Example 1

Except for using a thermoplastic polyurethane (PU-11) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, BD, and MDI were mixed at a mass ratio of PEG600:BD:MDI of 31.9:14.5:53.6, and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-11).

Comparative Example 2

Except for using a thermoplastic polyurethane (PU-12) produced in the following manner in place of PU-1, the thermoplastic polyurethane was evaluated, also a polishing pad was produced, and the polishing performance thereof was evaluated, in the same manner as in Example 1. The results are shown in Table 1.

Polyethylene glycol having a number-average molecular weight of 4000 [abbreviation: PEG4000], BD, and MDI were mixed at a mass ratio of PEG4000:BD:MDI of 27.7: 18.7:53.6, and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-12).

Comparative Example 3

Except for using a thermoplastic polyurethane (PU-13) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, BD, and MDI were mixed at a mass ratio of PEG600:BD:MDI of 60.5:3.8:35.8, and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-13).

Comparative Example 4

Except for using a thermoplastic polyurethane (PU-14) produced in the following manner in place of PU-1, the thermoplastic polyurethane was evaluated, also a polishing pad was produced, and the polishing performance thereof was evaluated, in the same manner as in Example 1. The results are shown in Table 1.

PEG600, BD, and MDI were mixed at a mass ratio of PEG600:BD:MDI of 3.3:25.2:71.5, and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-14).

Comparative Example 5

Except for using a thermoplastic polyurethane (PU-15) produced in the following manner in place of PU-1, the thermoplastic polyurethane was evaluated, also a polishing pad was produced, and the polishing performance thereof was evaluated, in the same manner as in Example 1. The results are shown in Table 1.

Polybutylene adipate having a number-average molecular weight of 2000 [abbreviation: PBA1000], BD, and MDI were mixed at a mass ratio of PBA1000:BD:MDI of 23.1:18.8:58.1, and the mixture was continuously supplied into a coaxially rotating twin-screw extruder using a metering pump, and subjected to continuous melt-polymerization, to give a thermoplastic polyurethane. The obtained thermoplastic polyurethane in the molten state was continuously extruded in the form of a strand into water so as to be solidified, and subsequently finely cut into a pellet with a pelletizer. The obtained pellet was dried through dehumidification for 20 hours at 70° C., to produce a thermoplastic polyurethane (PU-15).

From Table 1, it can be seen that the polishing pads obtained in Examples 1 to 10, in which the zeta potential at a pH of 10.0 was +0.1 mV or more, were able to achieve a high polishing rate even when an alkaline polishing slurry having a pH of 12 was used. In addition, these polishing pads also have excellent polishing uniformity, and caused no scratch. On the other hand, the polishing pads obtained in Comparative examples 1 to 5, in which the zeta potential at a pH of 10.0 was less than +0.1 mV, were not able to achieve a high polishing rate.

INDUSTRIAL APPLICABILITY

A polishing pad according to the present invention can achieve a high polishing rate even when a silicon oxide film or the like on a semiconductor substrate is polished by CMP using an alkaline polishing slurry, for example.

REFERENCE SIGNS LIST

1. ... Polishing pad
2. ... Rotary platen
3. ... Slurry supply nozzle
4. ... Carrier
5. ... Object to be polished
6. ... Pad conditioner
10. ... CMP apparatus

The invention claimed is:
1. A polishing pad, comprising:
a polyurethane having a tertiary amine, and a polishing surface having a zeta potential of +0.1 mV or more at a pH 10.0,
wherein the polishing pad is a non-foam polishing pad.
2. The polishing pad according to claim 1, wherein
the polyurethane having a tertiary amine is a reaction product of a polyurethane reaction raw material comprising a chain extender having a tertiary amine.
3. The polishing pad according to claim 2, wherein
the chain extender having a tertiary amine comprises at least one selected from the group consisting of 2,2'-methylimino diethanol, 2,2'-ethylimino diethanol, 2,2'-n-butylimino diethanol, 2,2'-t-butylimino diethanol, 3-(dimethylamino)-1,2-propane diol, and 3-(diethylamino)-1,2-propane diol.
4. The polishing pad according to claim 3, wherein
the polyurethane reaction raw material comprises from 0.5 to 30 mass % of the chain extender having a tertiary amine.
5. The polishing pad according to claim 3, wherein
the polyurethane reaction raw material further comprises a chain extender having no tertiary amine, and
a content ratio of the chain extender having a tertiary amine relative to a total amount of the chain extender having a tertiary amine and the chain extender having no tertiary amine is from 5 to 95 mol %.
6. The polishing pad according to claim 3, wherein
the polyurethane having a tertiary amine is a thermoplastic polyurethane that is a reaction product of the polyurethane reaction raw material comprising at least the chain extender having a tertiary amine, a polymer diol, and an organic diisocyanate.
7. The polishing pad according to claim 6, wherein
the polymer diol comprises from 30 to 100 mass % of polyethylene glycol.
8. The polishing pad according to claim 7, wherein
the polymer diol has a number-average molecular weight of from 450 to 3000.
9. The polishing pad according to claim 7, wherein
a content of nitrogen derived from an isocyanate group in the organic diisocyanate is from 4.5 to 7.6 mass %.
10. The polishing pad according to claim 1, wherein
the polishing pad has a storage modulus of from 50 to 1200 MPa at 50° C. after swollen to saturation with water at 50° C. and a contact angle with water of 80 degrees or less.
11. A polishing method, comprising:
fixing the polishing pad according to claim 1 onto a platen of a polishing device;
causing an object to be polished to be held on a holder of the polishing device so as to be opposed to the polishing surface of the polishing pad; and
polishing the object by causing the polishing pad and the object to slide relative to each other, while supplying an alkaline polishing slurry between the polishing surface and the object.

* * * * *